(12) United States Patent
Yu et al.

(10) Patent No.: US 12,332,523 B2
(45) Date of Patent: Jun. 17, 2025

(54) DISPLAY PANEL AND DISPLAY TERMINAL

(71) Applicant: Guangzhou China Star Optoelectronics Semiconductor Display Technology Co., LTd., Guangdong (CN)

(72) Inventors: Jing Yu, Guangdong (CN); Juan Xiao, Guangdong (CN)

(73) Assignee: Guangzhou China Star Optoelectronics Semiconductor Display Technology Co., LTd., Guangzhou (CN)

( * ) Notice: Subject to any disclaimer, the term of this patent is extended or adjusted under 35 U.S.C. 154(b) by 32 days.

(21) Appl. No.: 18/523,182

(22) Filed: Nov. 29, 2023

(65) Prior Publication Data

US 2024/0329468 A1    Oct. 3, 2024

(30) Foreign Application Priority Data

Mar. 29, 2023 (CN) .......................... 202310332931.0

(51) Int. Cl.
| | |
|---|---|
| *G02F 1/1345* | (2006.01) |
| *G02F 1/1333* | (2006.01) |
| *G02F 1/1368* | (2006.01) |
| *H10D 86/40* | (2025.01) |
| *H10D 86/60* | (2025.01) |
| *G02F 1/1343* | (2006.01) |
| *G02F 1/1362* | (2006.01) |

(52) U.S. Cl.
CPC .... *G02F 1/13452* (2013.01); *G02F 1/133388* (2021.01); *G02F 1/1368* (2013.01); *H10D 86/441* (2025.01); *H10D 86/60* (2025.01); *G02F 1/134372* (2021.01); *G02F 1/136231* (2021.01); *G02F 1/13625* (2021.01); *G02F 1/13629* (2021.01)

(58) Field of Classification Search
CPC ........................... G02F 1/13452; G02F 1/1368
See application file for complete search history.

(56) References Cited

U.S. PATENT DOCUMENTS

2020/0365623 A1* 11/2020 Chien ................. H01L 27/1288

* cited by examiner

*Primary Examiner* — Paisley L Wilson
(74) *Attorney, Agent, or Firm* — PV IP PC; Wei Te Chung

(57) ABSTRACT

A display panel and a display terminal are disclosed. display panel. The display panel has a display area and a non-display area on at least one side of the display area. The display panel includes: a first substrate; a first metal layer on the first substrate, the first metal layer including a first metal part disposed in the display area and a second metal part disposed in the non-display area; and a second metal layer on a side of the first metal layer away from the first substrate, the second metal layer including a third metal part in the display area and a fourth metal part in the non-display area.

16 Claims, 3 Drawing Sheets

US 12,332,523 B2

1
DISPLAY PANEL AND DISPLAY TERMINAL

CROSS-REFERENCE TO RELATED APPLICATION

This application claims priority to Chinese Patent Application No. 202310332931.0, filed on Mar. 29, 2023, the disclosure of which is incorporated herein by reference in its entirety.

FIELD

The present disclosure relates to display technologies, and in particular, to a display panel and a display terminal.

BACKGROUND

In order to achieve a narrow border of a display panel and improve a refresh rate of the display panel, it is necessary to reduce sheet resistance of a connecting line of the display panel. Due to a smaller sheet resistance of a connecting line compared to a sheet resistance of a metal wiring in the display area, it is impossible to share a photomask in the display area. An additional photomask is needed to make the connecting lines, and adding the photomask increases the production cost of the display panel.

It is necessary to reduce the sheet resistance of a connecting lines of a display panel without adding the photomask.

SUMMARY

A display panel according to the present disclosure has a display area and a non-display area on at least one side of the display area; the display panel including: a first substrate; a first metal layer on the first substrate, the first metal layer including a first metal part disposed in the display area and a second metal part disposed in the non-display area; and a second metal layer on a side of the first metal layer away from the first substrate, the second metal layer including a third metal part in the display area and a fourth metal part in the non-display area; the first metal layer and the second metal layer being separated by an insulating layer; an orthographic projection of the first metal part on the first substrate not overlapping with an orthographic projection of the third metal part on the first substrate, an orthographic projection of the second metal part on the first substrate overlapping with an orthographic projection of the fourth metal part on the first substrate, and the second metal part and the fourth metal part being electrically connected.

In one or more embodiments, the display panel further includes: multiple thin-film transistors in the display area, each of the thin-film transistors including a gate and an active part; multiple pixel electrodes, each of the pixel electrodes being spaced from an end of the active part of at least one of the thin-film transistors; a common electrode, the common electrode being disposed on a sides of at least one of the pixel electrodes away from the first substrate, and including a first common part in the display area and a second common part in the non-display area; the gate of each of the thin-film transistors being the first metal part, and each of the pixel electrodes being the third metal part, the second metal part being electrically connected to the second common part through a first via hole, and the fourth metal part being electrically connected to the second common part through a second via hole.

In one or more embodiments, the each of the thin-film transistors further includes a source and a drain, the drain being in contact with an end of the active part and the pixel electrode, and the source being electrically connected to another end of the active part; the display panel further including a fifth metal part, the fifth metal part and the drain being disposed on a same layer, the fifth metal part being disposed in the non-display area is in contact with the fourth metal part.

In one or more embodiments, an orthographic projection of the fifth metal part on the first substrate overlaps with the orthographic projection of the fourth metal part on the first substrate.

In one or more embodiments, the display panel further includes a sixth metal part in the non-display area, and the sixth metal part is disposed on a side of the fourth metal part away from the first substrate; the sixth metal part and the fourth metal part are separated by the insulating layer, the orthogonal projection of the second metal part on the first substrate and the orthogonal projection of the fourth metal part on the first substrate form an overlapping region, an orthogonal projection of the sixth metal part on the first substrate overlaps with the overlapping region, and the sixth metal part is electrically connected to the second common part through a third via hole.

In one or more embodiments, the second via hole is in contact with the fifth metal part, and an orthogonal projection of the second via hole on the fourth metal part is outside the fourth metal part.

In one or more embodiments, a hollow hole is provided in the sixth metal part, a material of the second common part fills the hollow hole, and an orthogonal projection of the hollow hole on the fourth metal part is within the fourth metal part.

In one or more embodiments, a through hole corresponding to the hollow hole is provided in at least one of the second metal part and the fourth metal part, and an orthogonal projection of the hollow hole on the first substrate overlaps with an orthogonal projection of the through hole on the first substrate.

In one or more embodiments, the display panel further comprises a second substrate opposite to the first substrate, the second substrate is disposed at a side of the second metal layer away from the first substrate, and a liquid crystal layer is provided between the first substrate and the second substrate.

A display terminal according to the present disclosure includes the display panel mentioned above.

Figure 1:
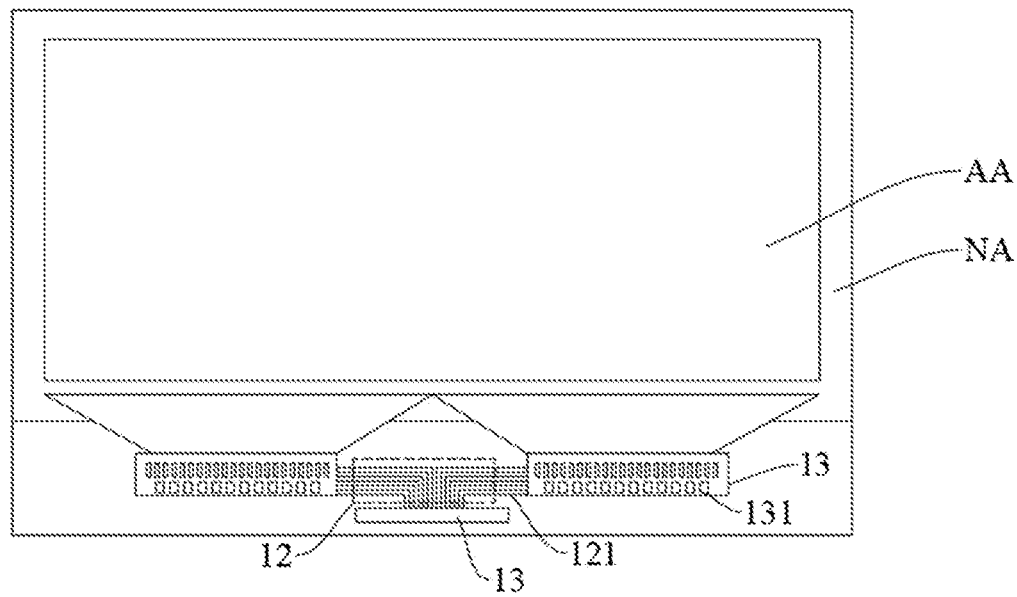
FIG. 1 illustrates a schematic structural diagram of a top view of a display panel according to the present disclosure.

DESCRIPTION OF REFERENCE NUMERALS display area AA; non-display area NA; first substrate 10; connecting line part 12; connecting line 121; bonding part 13; solder pad 131; first metal layer 11; first metal part 111; second metal part 112; second metal layer 21; third metal part 211; fourth metal part 212; insulating layer 80; thin-film transistor 40; gate 41; active part 42; pixel electrode 90; common electrode 50; first common part 51; second common part 52; first via hole HL1; second via hole HL2; third via hole HL3; source 43; drain 44; fifth metal part 61; sixth metal part 62; second substrate 20; liquid crystal layer 30; common electrode wiring 113; data line 45; scan line 114; hollow hole KL; through hole TL; first photomask 11A; second photomask 21A.

DETAILED DESCRIPTION

The following will provide a clear and complete description of the technical solutions in the embodiments of the present disclosure in conjunction with the attached drawings. In the attached drawings, for clarity and better understanding and description, thickness of a layer, film, plate, or region may have been enlarged. It should be understood that in a case that a component such as a layer, film, region, or substrate is referred to as "disposed on another component", it may be directly disposed on another component or there may also be a component therebetween. In the present disclosure, the directional words used, such as "up" and "down", generally refer to the up and down positions of the device in actual use or working state, specifically the surface direction in the attached drawings, unless otherwise specified; "inside" and "outside" are for the outline of the device.

Furthermore, unless explicitly described to the contrary, the term "including" and its variants such as "having" or "containing" will be understood as implying the inclusion of the discussed component, but not necessarily excluding other components. In addition, in the specification, the term "on" refers to being disposed above or below the object, and does not necessarily refer to being disposed on the upper side of the object based on the direction of gravity.

It can be understood that although the terms "first" and "second" may be used herein to describe various components, these components should not be limited by these terms. These components are only used to distinguish one component from another.

As used herein, the singular forms "an", "a", and "the" are also intended to include the plural form, unless the context explicitly indicates otherwise.

It is also to be understood that the terms "including" and/or "containing" used herein specify the existence of the features or components, but do not exclude the existence or addition of one or more other features or components.

It is also to be understood that in a case that a layer, region, or component is referred to as "formed on" another layer, region, or component, it may be directly or indirectly formed on another layer, region, or component. For example, there may be intermediate layers, regions, or components.

Apparently, the described embodiments are only part but not all of the embodiments of the present disclosure. Based on the embodiments in the present disclosure, all other embodiments obtained by those skilled in the art without creative labor fall within the scope of the present disclosure. In addition, it should be understood that the specific embodiments described herein are only for the purpose of explaining and illustrating the present disclosure, and are not intended to limit the present disclosure.

In order to achieve a narrow border of a display panel and improve a refresh rate of the display panel, it is necessary to reduce a sheet resistance of a connecting line of the display panel. Due to a smaller sheet resistance of a connecting line compared to a sheet resistance of a metal wiring in the display area, it is not possible to share a photomask in the display area. In the related art, an additional photomask is needed to make the connecting lines, which adds the photomask to cause the production cost of the display panel increasing.

A display panel according to the present disclosure includes a display area AA and a non-display area NA disposed on at least one side of the display area AA. The display panel includes a first substrate 10, a first metal layer 11 and a second metal layer 21. The first metal layer 11 is disposed on the first substrate 10. The first metal layer 11 includes a first metal part 111 disposed in the display area AA and a second metal part 112 disposed in the non-display area NA. The second metal layer 21 is disposed on a side of the first metal layer 11 away from the first substrate 10. The second metal layer 21 includes a third metal part 211 disposed in the display area AA and a fourth metal part 212 disposed in the non-display area NA. The first metal layer 11 and the second metal layer 21 are separated by an insulating layer 80. An orthographic projection of the first metal part 111 on the first substrate 10 does not overlap with an orthographic projection of the third metal part 211 on the first substrate 10, and an orthographic projection of the second metal part 112 on the first substrate 10 overlaps with an orthographic projection of the fourth metal part 212 on the first substrate 10. The second metal part 112 and the fourth metal part 212 are electrically connected.

A total sheet resistance of the second metal part 112 and the fourth metal part 212 is reduced by connecting the second metal part 112 and the fourth metal part 212 in the non-display area NA in parallel. Due to the fact that the second metal part 112 and the first metal part 111 in the display area AA are disposed on a same layer, and the fourth metal part 212 and the third metal part 211 in the display area AA are disposed on a same layer, the number of photomasks is not increased.

Figure 2:
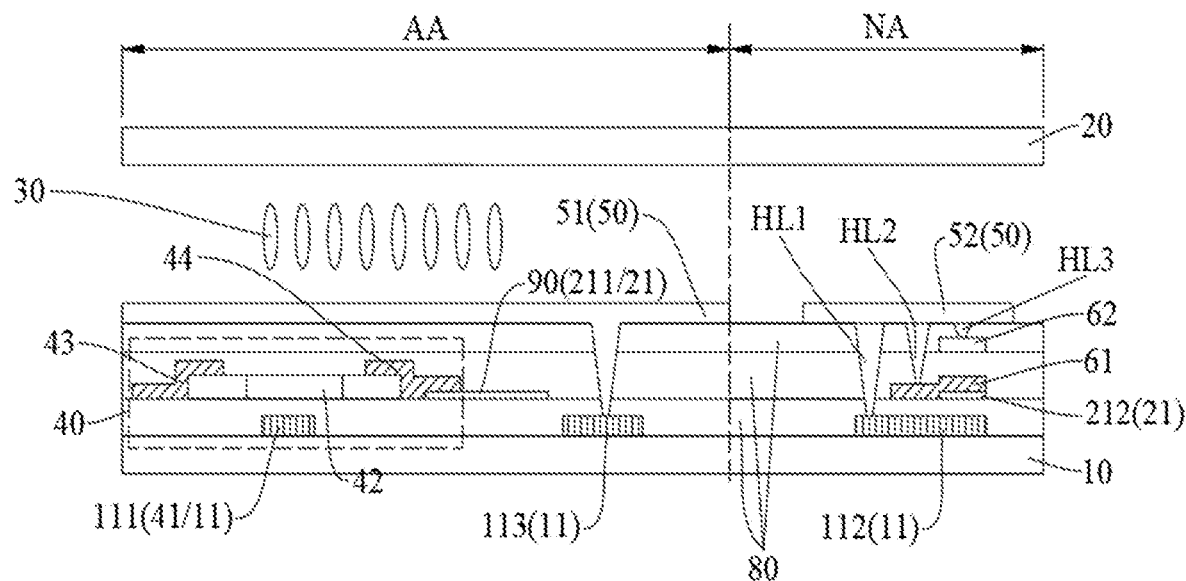
FIG. 2 illustrates a cross-sectional schematic structural diagram of the display panel in FIG. 1.
Figure 3:
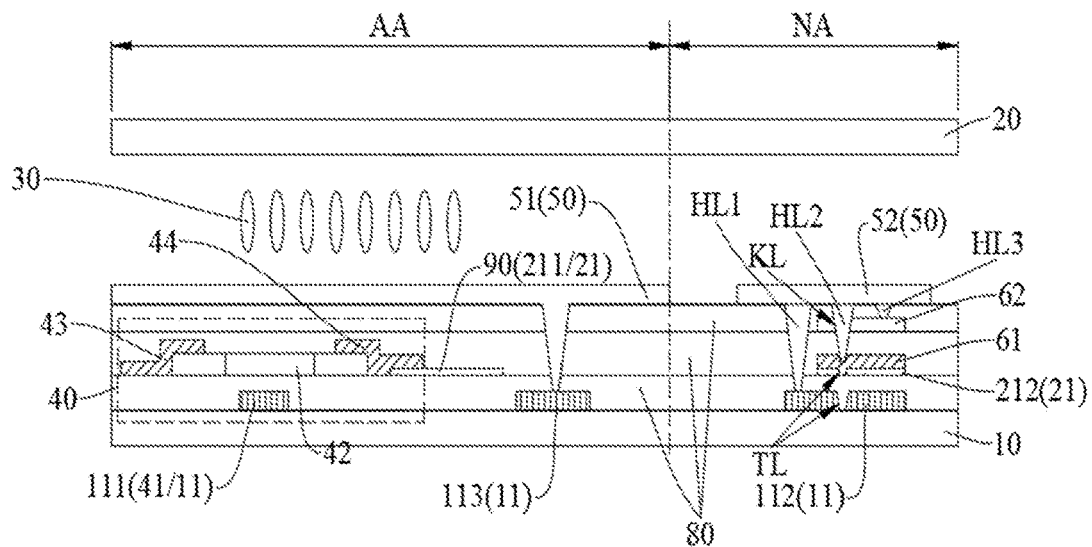
FIG. 3 illustrates another cross-sectional schematic structural diagram of the display panel in FIG. 1.
Figure 4:
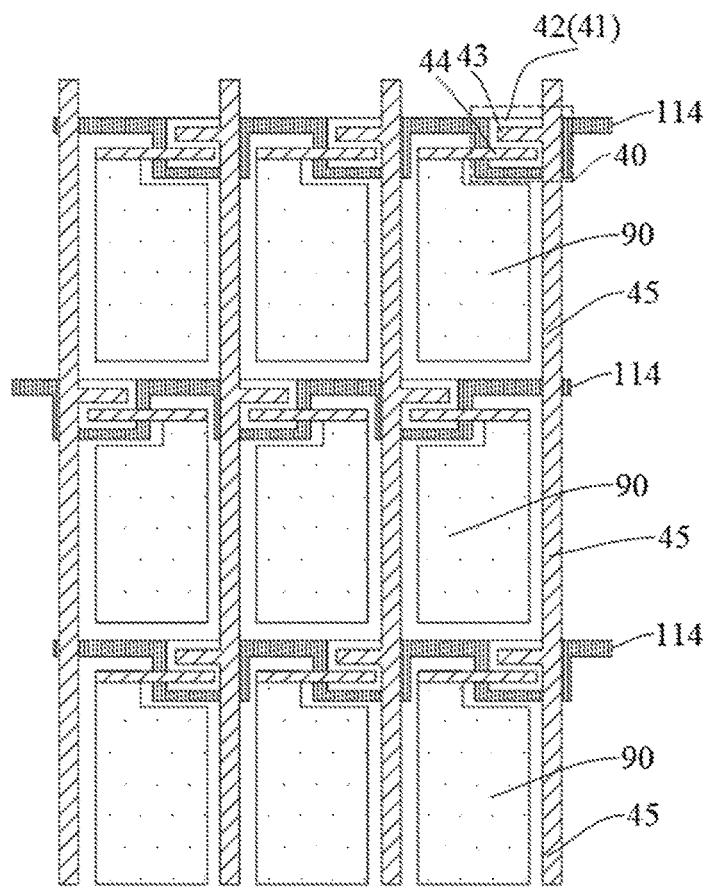
FIG. 4 illustrates a partially enlarged schematic structural diagram of the display panel in FIG. 1.

Referring to FIG. 1 to FIG. 4, FIG. 1 illustrates a schematic structural diagram of a top view of the display panel according to the present disclosure, FIG. 2 illustrates a cross-sectional schematic diagram of the display panel in FIG. 1, FIG. 3 illustrates another cross-sectional schematic diagram of the display panel in FIG. 1, and FIG. 4 illustrates a schematic diagram of a partially enlarged structure of the display panel in FIG. 1.

As shown in FIG. 1, the display panel includes the display area AA and the non-display area NA disposed on a periphery of the display area AA, and the display area AA is configured to display a screen. A bonding part 13 is disposed in the non-display area NA at a side of the display area AA, and the bonding part includes multiple solder pads 131. The bonding part is configured for bonding and connecting with external components. For example, the bonding parts 13 may be configured for binding and connecting with a driver chip, a flexible circuit board, or a chip on film, etc.

A connecting line part 12 is also disposed in the non-display area NA, and the connecting line part 12 includes multiple connecting lines. The connecting line part 12 is disposed between two adjacent bonding parts 13, and the connecting line 121 may be configured to connect the solder pad 131, or the connecting line 121 may be electrically connected to a circuit in the display area AA to provide a signal for the circuit in the display area AA, or the connecting line 121 may form a sandwich capacitor. FIG. 1 shows a case that the connecting line 121 is configured to connect the solder pad 131.

The display panel may be a liquid crystal display (LCD) panel, an organic light-emitting diode (OLED) panel, a mini light-emitting diode (Mini-LED) panel or a micro light-emitting diode (Micro-LED) panel.

As shown in FIG. 2 to FIG. 3, in the cross-sectional schematic diagram of the display panel, the display panel includes the first substrate 10, the first metal layer 11 disposed on the first substrate 10 and the second metal layer 21 disposed on a side of the first metal layer 11 away from the first substrate 10.

The first substrate 10 may be a flexible substrate or a rigid substrate, and a material of the first substrate 10 may be polyimide or glass.

The first metal layer 11 includes a first metal part 111 and a second metal part 112 that are patterned, the first metal part 111 is disposed in the display area AA and the second metal part 112 is disposed in the non-display area NA. The first metal part 111 and the second metal part 112 are spaced apart. The first metal part 111 and the second metal part 112 are disposed on a same layer, and may be formed by a same film forming process and patterned by a same photomask, thereby not increasing the number of photomasks. The materials of the first metal part 111 and the second metal part 112 are same. The first metal layer 11 may be one or more layers made of molybdenum (Mo), aluminum (Al), chromium (Cr), gold (Au), titanium (Ti), nickel (Ni), neodymium (Nd), copper (Cu) or their alloys.

The second metal layer 21 may include a third metal part 211 and a fourth metal part 212 that are patterned, the third metal part 211 is disposed in the display area AA and the fourth metal part 212 is disposed in the non-display area NA. The third metal part 211 and the fourth metal part 212 are spaced apart.

The third metal part 211 and the fourth metal part 212 are disposed on a same layer, may be formed by a same film forming process and patterned by a same photomask, thereby not increasing the number of photomasks. The materials of the third metal part 211 and the fourth metal part 212 are same. The second metal layer 21 is made of a transparent conductive material, such as a laminated layer of at least one of indium tin oxide (ITO), indium zinc oxide (IZO), indium zinc oxide (IZTO), indium aluminum zinc oxide (IAZO), indium gallium zinc oxide (IGZO), indium gallium tin oxide (IGTO), aluminum oxide zinc (AZO), antimony tin oxide (ATO) or indium gallium zinc oxide (IGZTO).

The orthographic projection of the first metal part 111 on the first substrate 10 does not overlap with the orthographic projection of the third metal part 211 on the first substrate 10, that is, the orthographic projections of the first metal part 111 and the third metal part 211 on the substrate 10 are staggered from each other.

The orthographic projection of the second metal part 112 on the first substrate 10 overlaps with the orthographic projection of the fourth metal part 212 on the first substrate 10, thereby connecting the second metal part 112 and the fourth metal part 212 in parallel through a via hole to form the connecting line 121. Therefore, by connecting multiple layers of metal in parallel, the sheet resistance of the connecting line 121 can be reduced, resulting in a narrow border and increased refresh frequency of the display panel.

It should be noted that, the first metal layer 11 and the second metal layer 21 may be any metal layer within the display area AA, as long as orthographic projections of film patterns of the first metal layer 11 and the second metal layer 21 on the first substrate 10 do not overlap with each other. Positions of film layers of the first metal layer 11 and the second metal layer 21 are not limited herein.

The insulating layer 80 may be a single layer or laminated layers of silicon nitride and silicon oxynitride, but is not limited to this.

The technical solution of the present disclosure is described in conjunction with one or more embodiments.

As shown in FIG. 4, FIG. 4 illustrates a partially enlarged schematic diagram of a display area AA of a display panel. The display area AA of the display panel includes multiple scan lines 114 extending in a direction and multiple data lines 45 extending in another direction. The scan lines 114 intersect with the data lines 45 to form multiple pixel regions. Each pixel region is provided with a corresponding pixel electrode 90 and at least one thin-film transistor 40.

As shown in FIG. 2 to FIG. 3, the thin-film transistor 40 includes a gate 41, an active part 42, a source 43 and a drain 44. The gate 41 is disposed on a side of the active part 42 close to the first substrate 10, and an insulating layer 80 is provided between the gate 41 and the active part 42. The source 43 and the drain 44 are disposed on a side of the active part 42 away from the first substrate 10, and the source 43 and the drain 44 are respectively connected to two ends of the active part 42. The source 43 and the drain 44 are disposed on a same layer, and may be formed by a same film forming process and patterned by a same photomask, thereby not increasing the number of the photomasks. The materials of the source 43 and the drain 44 are the same. The source 43 and the drain 44 may be one or more layers made of Mo, Al, Cr, Au, Ti, Ni, Nd, Cu or their alloys.

It should be noted that, FIG. 4 shows a pixel structure, and the technical solutions of the present disclosure may be applied to other pixel structures, not limited to the pixel structure in FIG. 4.

The pixel electrode 90 may be disposed on a same layer as the active part 42, and the active part 42 may be made of monocrystalline silicon, polycrystalline silicon, etc., but is not limited to this. An end of the drain 44 is in contact with the active part 42, and another end of the drain 44 is in contact with the pixel electrode 90, allowing the driving signal to be transmitted to the pixel electrode 90 through the thin-film transistor 40.

In one or more embodiments, the gate 41 is the first metal part 111, and the pixel electrode 90 is the third metal part 211. As shown in FIG. 4, the gate 41 is integrated with the scan line 114, and the gate 41 overlaps with the active part 42. As shown in FIG. 3, the gate 41 is disposed below the active part 42 and is obstructed by the active part 42. The source 43 is integrated with the data line 45, and the drain 44 is connected to the active part 42 and the pixel electrode 90. The orthographic projection of the gate 41 on the first substrate 10 does not overlap with the orthographic projection of the pixel electrode 90 on the first substrate 10.

Referring to FIG. 2 to FIG. 3, the second metal part 112 and the gate 41 are disposed on the same layer, and may be formed by a same film forming process and patterned by a same photomask, thereby not increasing the number of the photomasks. The materials of the gate 41 and the second metal part 112 are same.

The fourth metal part 212 and the pixel electrode 90 are disposed on the same layer, and may be formed by a same film forming process and patterned by a same photomask, thereby not increasing the number of the photomasks. The materials of the fourth metal part 212 and the pixel electrode 90 are same.

Referring to FIG. 2 to FIG. 3, the display panel further includes a common electrode 50. The common electrode 50 includes a first common part 51 in the display area AA and a second common part 52 in the non-display area NA, and the first common part 51 and the second common part 52 are spaced apart. The display area AA includes a common electrode wiring 113, the common electrode wiring 113 may be disposed in the first metal layer 11 and is connected to the common electrode 50 through a via hole. The common electrode wiring 113 is configured for providing voltage signals to the common electrode 50. The common electrode 50 is made of a transparent conductive material, such as a laminated layer by at least one of ITO, IZO, IZTO, IAZO, IGZO, IGTO, AZO, ATO or IGZTO.

The second metal part 112 is electrically connected to the second common part 52 through a first via HL1, and the fourth metal part 212 is electrically connected to the second common part 52 through a second via HL2. It should be noted that, FIG. 2 and FIG. 3 also illustrate a fifth metal part 61. In one or more embodiments, the fifth metal part 61 may be omitted. That is, the second common part 52 and the fourth metal part 212 are directly and electrically connected through the second via HL2. By the configuration, the connecting lines 121 can be connected in parallel by three layers of the second metal part 112, the fourth metal part 212 and the second common part 52, thereby reducing the sheet resistance of the connecting line 121.

Further, in one or more embodiments, as shown in FIG. 2 and FIG. 3, the non-display area NA includes a fifth metal part 61, and the fifth metal part 61 and the drain 44 are disposed on the same layer, may be formed by a same film forming process and patterned by a same photomask, thereby not increasing the number of the photomasks. The materials of the fifth metal part 61 and the drain 44 are the same. The fifth metal part 61 may be one or more layers made of Mo, Al, Cr, Au, Ti, Ni, Nd, and Cu or their alloys.

By the configuration, the connecting line 121 may be connected in parallel by four metal layers of the second metal part 112, the fourth metal part 212, the fifth metal part 61 and the second common part 52. The fifth metal part 61 is directly in contact with the fourth metal part 212, further reducing the sheet resistance of the connecting line 121.

As shown in FIG. 2, based on all the above embodiments, the display panel further includes a sixth metal part 62 in the non-display area NA, and the sixth metal part 62 is disposed on a side of the fourth metal part 212 away from the first substrate 10. An insulating layer 80 is provided between the sixth metal part 62 and the fourth metal part 212. The orthogonal projection of the second metal part 112 on the first substrate 10 and the orthogonal projection of the fourth metal part 212 on the first substrate 10 form an overlapping region, an orthogonal projection of the sixth metal part 62 on the first substrate 10 overlaps with the overlapping region on the first substrate 10. That is, an orthographic projection pattern of the sixth metal part 62 is an intersection of orthographic projection patterns of the second metal part 112 and the fourth metal part 212. The sixth metal part 62 is electrically connected to the second common part 52 through the third via hole HL3.

By such a configuration, the connecting line 121 may be connected in parallel by five layers of metal of the second metal part 112, the fourth metal part 212, the fifth metal part 61, the sixth metal part 62 and the second common part 52, further reducing the sheet resistance of the connecting line 121.

It should be noted that, due to the fact that the orthographic projection pattern of the sixth metal part 62 is an intersection of the orthographic projection patterns of the second metal part 112 and the fourth metal part 212, the photomasks of the second metal part 112 and the sixth metal part 62 can be used for two exposures to obtain the pattern of the sixth metal part 62. Therefore, the sheet resistance of the connecting line 121 can be reduced without adding the photomask, and.

Figure 5A:
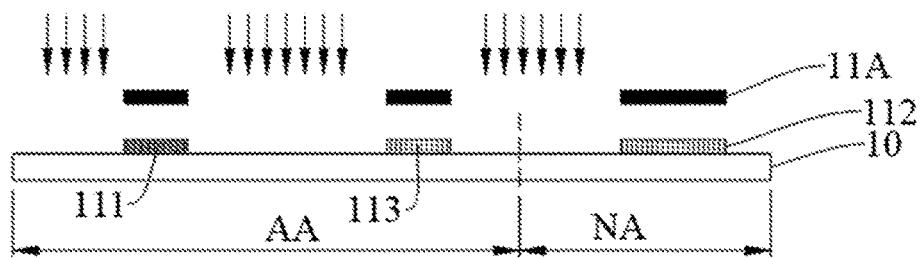
FIG. 5A to FIG. 5C illustrate a flowchart of a patterning process of some film layers on a display panel according to the present disclosure.
Figure 5B:
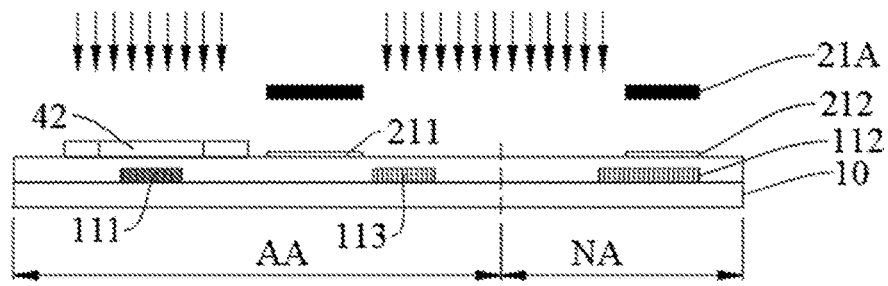
Figure 5C:
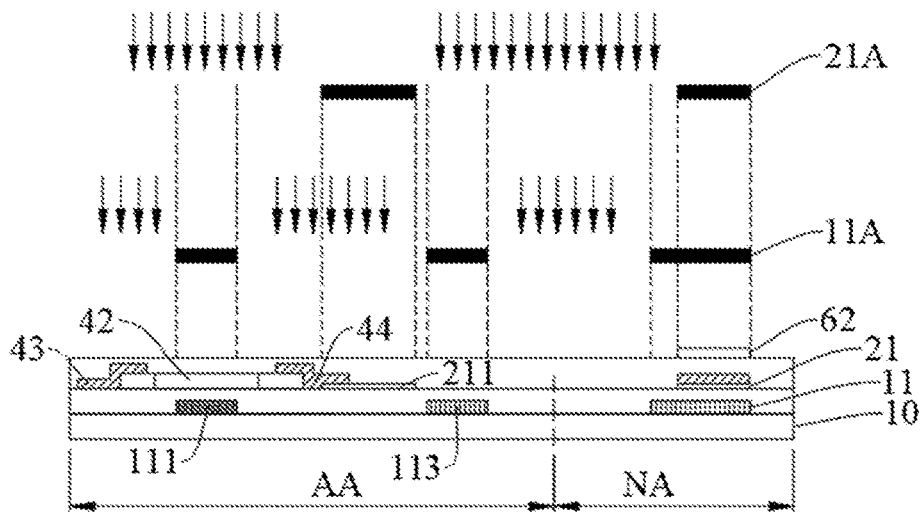

Specifically, FIG. 5A to FIG. 5C illustrate a flowchart of a patterning process of some film layers on the display panel according to the present disclosure and show how to form the sixth metal part 62 without adding the photomask. The patterning process includes forming a whole layer of metal film, coating photoresist, using a photomask to expose and develop the photoresist, and etching, so as to complete the patterning of the metal film layer.

FIG. 5A illustrates a process for forming the first metal layer 11. A whole layer of the first metal layer 11 is formed, and the photoresist is coated on a surface of the first metal layer 11. A first photomask 11A is a photomask for patterning the first metal layer 11. The first photomask 11A includes an exposure region and a light-shielding region (a black square region in the drawing). Light (shown by arrows in FIG. 5A) is directed from the exposure regions to the photoresist (not shown in the drawing). The first metal layer 11 in the exposure region is etched in a subsequent etching process, thereby retaining the first metal part 111 and the second metal part 112.

FIG. 5B illustrates a process for forming the second metal layer 21. A whole layer of the second metal layer 21 is formed, and the photoresist is coated on a surface of the second metal layer 21. A second photomask 21A is a photomask for patterning the second metal layer 21. The second photomask 21A includes an exposure region and a light-shielding region (a black square region in the drawing), and the light (shown by arrows in FIG. 5B) is directed from the exposure region to the photoresist (not shown in the drawing). The second metal layer 21 in the exposure region is etched in a subsequent etching process, thereby retaining the third metal part 211 and the fourth metal part 212.

FIG. 5C illustrates a process for forming the sixth metal part 62. A whole layer of metal layer is formed (not shown in the drawing), and the photoresist (not shown in the attached drawing) is coated on a surface of the metal layer. The photoresist is exposed by using the first photomask 11A, a pattern corresponding to the exposure region of the first photomask 11A may be etched by a subsequent process after exposure. Then, the photoresist is exposed by using the second photomask 21A, and a pattern corresponding to the exposure region of the second photomask 21A may be etched by a subsequent process after exposure. It should be noted that, in the display area AA, since patterns of the first photomask 11A and the second photomask 21A do not overlap, the metal layer in the display area AA is exposed in two exposures, and may be etched in a subsequent etching process.

In the non-display area NA, since the light-shielding region of the first photomask 11A and the light-shielding region of the second photomask 21A overlap, a pattern in an overlapping region is not exposed and can be retained in a subsequent etching process to form the sixth metal part 62. That is, the orthogonal projection of the second metal part 112 on the first substrate 10 and the orthogonal projection of the fourth metal part 212 on the first substrate 10 form the overlapping region, and the orthogonal projection of the sixth metal part on the first substrate 10 coincides with the overlapping region.

In one or more embodiments, as shown in FIG. 2, the orthogonal projection of the fifth metal part 61 on the first substrate 10 overlaps with the orthogonal projection of the fourth metal part 212 on the first substrate 10, and the orthogonal projection of the fourth metal part 212 on the first substrate 10 is within the orthogonal projection of the fifth metal part 61 on the first substrate 10. An end of the second via hole HL2 is electrically connected to the second common part 52, and another end of the second via hole HL2 is electrically connected to the fifth metal part 61. By such a configuration, an electrical connection between the second common part 52 and the fourth metal part 212 can be achieved by the fifth metal part 61 and the second via hole HL2, further reducing the sheet resistance of the connecting line 121.

In one or more embodiments, as shown in FIG. 3, a hollow hole KL is provided in the sixth metal part 62. A material of the second common part 52 fills the hollow hole KL. An orthogonal projection of the hollow hole KL on the fourth metal part 212 is within the fourth metal part 212. By such a configuration, the second via hole HL2 can be disposed in the sixth metal part 62, thereby saving space of the via hole.

Further, a through hole TL corresponding to the hollow hole KL is provided in at least one of the second metal part 112 and the fourth metal part 212. Since the sixth metal part 62 is formed by using the first photomask 11A and the second photomask 21A, when it is necessary to form the hollow hole KL on the sixth metal part 62, the through hole TL may be formed at least in a corresponding region on the first photomask 11A and the second photomask 21A. Therefore, a through hole TL corresponding to the hollow hole KL is formed on at least one of the second metal part 112 and the fourth metal part 212, thereby forming the sixth metal part 62 by using the first photomask 11A and the second photomask 21A. In this case, the orthogonal projection of the hollow hole KL on the first substrate 10 overlaps with the orthogonal projection of the through hole TL on the first substrate 10. Therefore, it is not necessary to add the photomask to form the second via hole HL2.

It should be noted that in all the above embodiments, the first via hole HL1, the second via hole HL2, and the third via hole HL3 are formed by the same photomask, thus not increasing the number of photomasks.

In one or more embodiments, as shown in FIG. 2 and FIG. 3, the display panel further includes a second substrate 20 opposite to the first substrate 10. The second substrate 20 is disposed on a side of the second metal layer 21 away from the first substrate 10. A liquid crystal layer 30 is provided between the first substrate 10 and the second substrate 20. The pixel electrode 90 and the common electrode 50 above the first substrate 10 form an electric field, driving a liquid crystal deflection in the liquid crystal layer 30.

The display panel further includes a backlight module on a side of the first substrate 10 away from the second substrate 20. The backlight module is configured to provide a white light source. The liquid crystal layer 30 can control transmittance of a light source emitted by the backlight module, thereby achieving screen display.

A display terminal according to the present disclosure includes the display panel mentioned above.

In one or more embodiments, the display terminal may be any product or component with display functions, such as mobile phone, tablet computer, television, monitor, laptop, digital photo frame and navigator.

In one or more embodiments, the descriptions of each embodiment have their own emphasis. For the parts that are not detailed in an embodiment, please refer to the relevant descriptions of other embodiments.

The above provides a detailed introduction to the display panel and the display terminal according to one or more embodiments of the present disclosure. Specific examples are applied in the context to explain the principles and embodiments of the present disclosure. The explanations of the above embodiments are only used to help understand the technical solutions and their core ideas of the present disclosure. Those skilled in the art should understand that they can still modify the technical solutions recorded in the aforementioned embodiments, or equivalently replace some of the technical features. And these modifications or replacements do not make the essence of the corresponding technical solutions deviate from the scope of the technical solutions of the various embodiments of the present disclosure.

What is claimed is:

1. A display panel, having a display area and a non-display area on at least one side of the display area;
   the display panel comprising:
   a first substrate;
   a first metal layer on the first substrate, wherein the first metal layer comprises a first metal part disposed in the display area and a second metal part disposed in the non-display area; and
   a second metal layer on a side of the first metal layer away from the first substrate, wherein the second metal layer comprises a third metal part in the display area and a fourth metal part in the non-display area;
   wherein the first metal layer and the second metal layer are separated by an insulating layer; an orthogonal projection of the first metal part on the first substrate does not overlap with an orthogonal projection of the third metal part on the first substrate, an orthogonal projection of the second metal part on the first substrate overlaps with an orthogonal projection of the fourth metal part on the first substrate, and the second metal part and the fourth metal part are electrically connected;
   wherein the display panel further comprises:
   a plurality of thin-film transistors in the display area, wherein each of the thin-film transistors comprises a gate and an active part;
   a plurality of pixel electrodes, wherein each of the pixel electrodes is spaced from an end of the active part of at least one of the thin-film transistors;
   a common electrode, wherein the common electrode is disposed on a side of at least one of the pixel electrodes away from the first substrate, and comprises a first common part in the display area and a second common part in the non-display area;
   wherein the gate of each of the thin-film transistors is the first metal part, and each of the pixel electrodes is the third metal part, the second metal part is electrically connected to the second common part through a first via hole, and the fourth metal part is electrically connected to the second common part through a second via hole.

2. The display panel according to claim 1, wherein the each of the thin-film transistors further comprises a source and a drain, the drain is in contact with an end of the active part and the pixel electrode, and the source is electrically connected to another end of the active part;
   wherein the display panel further comprises a fifth metal part, the fifth metal part and the drain are disposed on a same layer, the fifth metal part is disposed in the non-display area and is in contact with the fourth metal part.

3. The display panel according to claim 2, wherein an orthogonal projection of the fifth metal part on the first substrate overlaps with the orthogonal projection of the fourth metal part on the first substrate.

4. The display panel according to claim 2, wherein the display panel further comprises a sixth metal part in the non-display area, and the sixth metal part is disposed on a side of the fourth metal part away from the first substrate;
wherein the sixth metal part and the fourth metal part are separated by the insulating layer, the orthogonal projection of the second metal part on the first substrate and the orthogonal projection of the fourth metal part on the first substrate form an overlapping region, an orthogonal projection of the sixth metal part on the first substrate overlaps with the overlapping region, and the sixth metal part is electrically connected to the second common part through a third via hole.

5. The display panel according to claim 4, wherein the second via hole is in contact with the fifth metal part, and an orthogonal projection of the second via hole on the fourth metal part is outside the fourth metal part.

6. The display panel according to claim 4, wherein a hollow hole is provided in the sixth metal part, a material of the second common part fills the hollow hole, and an orthogonal projection of the hollow hole on the fourth metal part is within the fourth metal part.

7. The display panel according to claim 6, wherein a through hole corresponding to the hollow hole is provided in at least one of the second metal part and the fourth metal part, and an orthogonal projection of the hollow hole on the first substrate overlaps with an orthogonal projection of the through hole on the first substrate.

8. The display panel according to claim 1, wherein the display panel further comprises a second substrate opposite to the first substrate, the second substrate is disposed at a side of the second metal layer away from the first substrate, and a liquid crystal layer is provided between the first substrate and the second substrate.

9. A display terminal comprising a display panel,
wherein the display panel has a display area and a non-display area on at least one side of the display area;
the display panel comprises:
a first substrate;
a first metal layer on the first substrate, wherein the first metal layer comprises a first metal part disposed in the display area and a second metal part disposed in the non-display area; and
a second metal layer on a side of the first metal layer away from the first substrate, wherein the second metal layer comprises a third metal part in the display area and a fourth metal part in the non-display area;
wherein the first metal layer and the second metal layer are separated by an insulating layer; an orthogonal projection of the first metal part on the first substrate does not overlap with an orthogonal projection of the third metal part on the first substrate, an orthogonal projection of the second metal part on the first substrate overlaps with an orthogonal projection of the fourth metal part on the first substrate, and the second metal part and the fourth metal part are electrically connected;
wherein the display panel further comprises:
a plurality of thin-film transistors in the display area, wherein each of the thin-film transistors comprises a gate and an active part;
a plurality of pixel electrodes, wherein each of the pixel electrodes is spaced from an end of the active part of at least one of the thin-film transistors;
a common electrode, wherein the common electrode is disposed on a side of at least one of the pixel electrodes away from the first substrate, and comprises a first common part in the display area and a second common part in the non-display area;
wherein the gate of each of the thin-film transistors is the first metal part, and each of the pixel electrodes is the third metal part, the second metal part is electrically connected to the second common part through a first via hole, and the fourth metal part is electrically connected to the second common part through a second via hole.

10. The display terminal according to claim 9, wherein the each of the thin-film transistors further comprises a source and a drain, the drain is in contact with an end of the active part and the pixel electrode, and the source is electrically connected to another end of the active part;
wherein the display panel further comprises a fifth metal part, the fifth metal part and the drain are disposed on a same layer, the fifth metal part is disposed in the non-display area and is in contact with the fourth metal part.

11. The display terminal according to claim 10, wherein an orthogonal projection of the fifth metal part on the first substrate overlaps with the orthogonal projection of the fourth metal part on the first substrate.

12. The display terminal according to claim 10, wherein the display panel further comprises a sixth metal part in the non-display area, and the sixth metal part is disposed on a side of the fourth metal part away from the first substrate;
wherein the sixth metal part and the fourth metal part are separated by the insulating layer, the orthogonal projection of the second metal part on the first substrate and the orthogonal projection of the fourth metal part on the first substrate form an overlapping region, an orthogonal projection of the sixth metal part on the first substrate overlaps with the overlapping region, and the sixth metal part is electrically connected to the second common part through a third via hole.

13. The display terminal according to claim 12, wherein the second via hole is in contact with the fifth metal part, and an orthogonal projection of the second via hole on the fourth metal part is outside the fourth metal part.

14. The display terminal according to claim 12, wherein a hollow hole is provided in the sixth metal part, a material of the second common part fills the hollow hole, and an orthogonal projection of the hollow hole on the fourth metal part is within the fourth metal part.

15. The display terminal according to claim 14, wherein a through hole corresponding to the hollow hole is provided in at least one of the second metal part and the fourth metal part, and an orthogonal projection of the hollow hole on the first substrate overlaps with an orthogonal projection of the through hole on the first substrate.

16. The display terminal according to claim 9, wherein the display panel further comprises a second substrate opposite to the first substrate, the second substrate is disposed at a side of the second metal layer away from the first substrate, and a liquid crystal layer is provided between the first substrate and the second substrate.

* * * * *